US012545992B2

(12) United States Patent
Lee et al.

(10) Patent No.: US 12,545,992 B2
(45) Date of Patent: Feb. 10, 2026

(54) PLASMA-RESISTANT MEMBER HAVING STACKED STRUCTURE AND METHOD FOR FABRICATING THE SAME

(71) Applicant: SAMSUNG ELECTRONICS CO., LTD., Suwon-si (KR)

(72) Inventors: Inhwan Lee, Seoul (KR); Kangbin Bae, Seoul (KR)

(73) Assignees: SAMSUNG ELECTRONICS CO., LTD., Suwon-si (KR); Korea University Research and Business Foundation, Seoul (KR)

( * ) Notice: Subject to any disclaimer, the term of this patent is extended or adjusted under 35 U.S.C. 154(b) by 407 days.

(21) Appl. No.: 18/134,296

(22) Filed: Apr. 13, 2023

(65) Prior Publication Data

US 2024/0026521 A1 Jan. 25, 2024

(30) Foreign Application Priority Data

Jul. 21, 2022 (KR) .......................... 10-2022-089978

(51) Int. Cl.
| | |
|---|---|
| B32B 17/06 | (2006.01) |
| B32B 15/04 | (2006.01) |
| C23C 14/02 | (2006.01) |
| C23C 14/08 | (2006.01) |
| C23C 14/30 | (2006.01) |
| H01L 21/683 | (2006.01) |

(52) U.S. Cl.
CPC ............ C23C 14/083 (2013.01); C23C 14/02 (2013.01); C23C 14/081 (2013.01); C23C 14/30 (2013.01); H01L 21/6833 (2013.01)

(58) Field of Classification Search
CPC ...................................................... C23C 14/083
USPC ........................................................... 428/702
See application file for complete search history.

(56) References Cited

U.S. PATENT DOCUMENTS

| | | | |
|---|---|---|---|
| 8,877,002 B2 | 11/2014 | Mitsuhashi et al. | |
| 9,790,582 B2 | 10/2017 | Liu et al. | |
| 9,869,013 B2 | 1/2018 | Sun et al. | |
| 9,970,095 B2 | 5/2018 | Sun et al. | |
| 10,443,125 B2 * | 10/2019 | Wu | ........................ C23C 16/405 |
| 10,538,845 B2 * | 1/2020 | Iguchi | ................... C23C 28/042 |
| 10,982,331 B2 | 4/2021 | Lee et al. | |

(Continued)

FOREIGN PATENT DOCUMENTS

| | | |
|---|---|---|
| KR | 10-2016-0033047 A | 3/2016 |
| KR | 10-2016-0127667 A | 11/2016 |

(Continued)

OTHER PUBLICATIONS

Office Action dated Jan. 24, 2025, issued by Taiwanese Patent Office in Taiwanese Patent Application No. 112116856.

(Continued)

*Primary Examiner* — Lauren R Colgan
(74) *Attorney, Agent, or Firm* — Sughrue Mion, PLLC

(57) ABSTRACT

A plasma-resistant member includes a lower layer disposed on a substrate and including yttrium oxide, a buffer layer disposed on the lower layer, and an upper layer disposed on the buffer layer and including yttrium oxyfluoride or fluorine-rich yttrium oxide, wherein the buffer layer has a thermal expansion coefficient between a thermal expansion coefficient of the upper layer and a thermal expansion coefficient of the lower layer.

16 Claims, 7 Drawing Sheets

(56) References Cited

U.S. PATENT DOCUMENTS

| | | | |
|---|---|---|---|
| 11,008,653 B2 | 5/2021 | Fenwick et al. | |
| 11,424,140 B2 * | 8/2022 | Kim | H01L 21/67069 |
| 12,139,785 B2 * | 11/2024 | Kwon | H01J 37/32174 |
| 12,198,902 B2 * | 1/2025 | Xu | H01J 37/32559 |
| 12,247,296 B2 * | 3/2025 | Hanamachi | C23C 28/04 |
| 2017/0314125 A1 * | 11/2017 | Fenwick | C23C 28/042 |
| 2018/0330923 A1 * | 11/2018 | Tran | C23C 16/04 |
| 2022/0010426 A1 | 1/2022 | Waldfried et al. | |
| 2022/0115214 A1 * | 4/2022 | Xu | H01J 37/32477 |

FOREIGN PATENT DOCUMENTS

| | | |
|---|---|---|
| KR | 10-2018-0000309 A | 1/2018 |
| KR | 10-2021-0131150 A | 11/2021 |
| TW | 201606105 A | 2/2016 |
| TW | 201805450 A | 2/2018 |
| TW | 202208074 A | 3/2022 |
| TW | 202212599 A | 4/2022 |

OTHER PUBLICATIONS

Search Report dated Jan. 21, 2025, issued by Taiwanese Patent Office in Taiwanese Patent Application No. 112116856.

Communication issued on Jan. 6, 2026 by the Korean Ministry of Intellectual Property (MOIP) in Korean Patent Application No. 10-2022-0089978.

* cited by examiner

PLASMA-RESISTANT MEMBER HAVING STACKED STRUCTURE AND METHOD FOR FABRICATING THE SAME

CROSS-REFERENCE TO RELATED APPLICATION

This application claims priority to Korean Patent Application No. 10-2022-0089978 filed on Jul. 21, 2022 in the Korean Intellectual Property Office (KIPO), the entire disclosure of which is incorporated herein by reference.

BACKGROUND

1. Field

The present disclosure relates to a plasma-resistant member. More specifically, the present disclosure relates to a plasma-resistant member having a stacked structure and a method for fabricating the same.

2. Description of the Related Art

When manufacturing electronic devices such as semiconductor devices, processes using plasma, such as etching using plasma, vapor deposition using plasma, etc., are widely used.

In a process using plasma, highly chemically active radicals and dissociated ions are generated, which may physically/chemically damage parts exposed to plasma. Accordingly, a method of forming a ceramic coating layer on a surface of a component such as plasma spraying is used.

SUMMARY

An object of the present disclosure is to provide a plasma-resistant member having a stacked structure capable of suppressing generation of contaminant particles and surface cracks.

Another object of the present disclosure is to provide a method for fabricating the plasma-resistant member.

In order to accomplish the above objects of the present disclosure, a plasma-resistant member according to example embodiments of the present disclosure includes a lower layer disposed on a substrate and including yttrium oxide, a buffer layer disposed on the lower layer, and an upper layer disposed on the buffer layer and including yttrium oxyfluoride or fluorine-rich yttrium oxide, wherein the buffer layer has a thermal expansion coefficient between a thermal expansion coefficient of the upper layer and a thermal expansion coefficient of the lower layer.

In a method for fabricating a plasma-resistant member to accomplish the above objects according to example embodiments of the present disclosure, a lower layer including yttrium oxide may be deposited on a substrate, a buffer layer may be deposited on the lower layer, and an upper layer including yttrium oxyfluoride or fluorine-rich yttrium oxide may be deposited on the buffer layer. The buffer layer may have a thermal expansion coefficient between a thermal expansion coefficient of the upper layer and a thermal expansion coefficient of the lower layer.

According to example embodiments, the stacked structure having plasma resistance can be formed through vapor deposition. Therefore, the stacked structure may have a denser structure than a conventional plasma-resistant coating layer formed through spray coating, without a heat treatment process for sintering.

In addition, the upper layer of the stacked structure may include yttrium oxyfluoride or fluorine-rich yttrium oxide, thereby suppressing generation of contaminant particles and reducing variations in plasma composition in the chamber.

In addition, the stacked structure includes a buffer layer disposed between the upper layer and the lower layer, thereby improving the quality of the upper layer. Accordingly, the surface roughness of the upper layer may be reduced, and crack generation may be suppressed.

However, the present disclosure is not limited to the above-described effects, and may be variously expanded without departing from the spirit and scope of the present disclosure.

DETAILED DESCRIPTION

Hereinafter, example embodiments of the present disclosure will be described in more detail with reference to the accompanying drawings.

Plasma-Resistant Member Having a Stacked Structure

Figure 1:
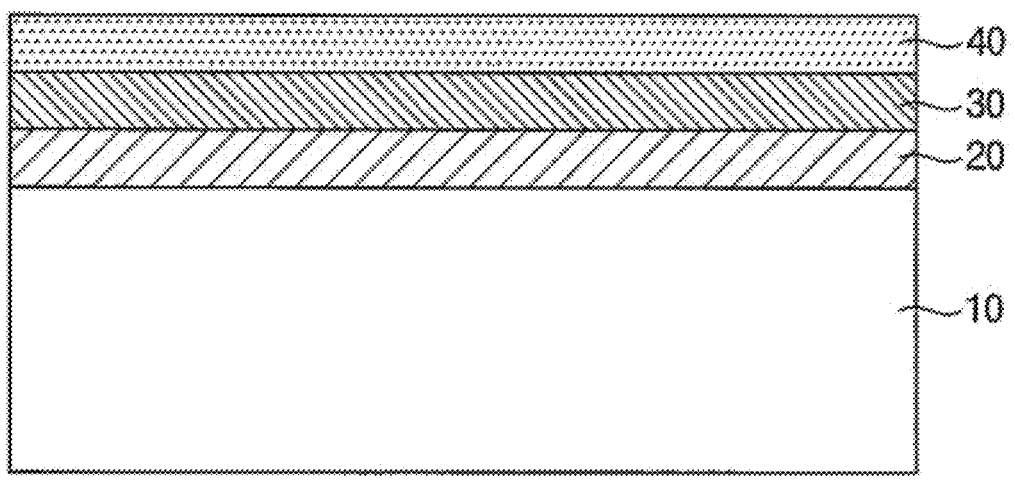
FIGS. 1, 2 and 3 are cross-sectional views showing a plasma-resistant member according to embodiments of the present disclosure.
Figure 2:
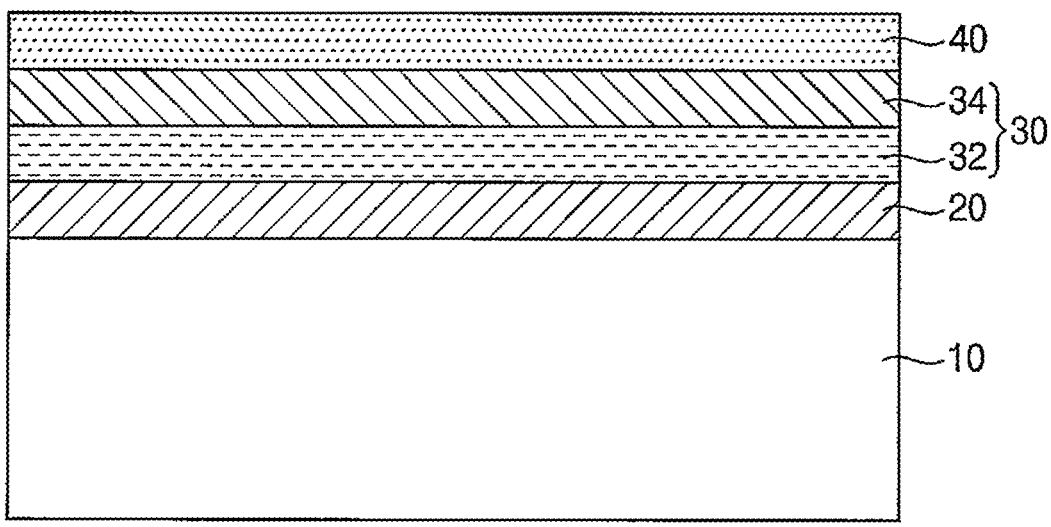
Figure 3:
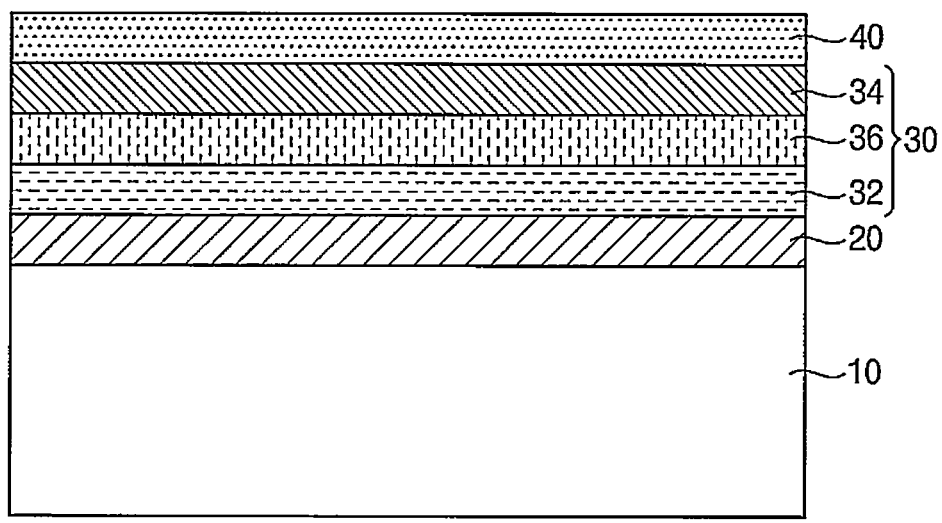

FIGS. 1, 2 and 3 are cross-sectional views showing a plasma-resistant member according to embodiments of the present disclosure.

Referring to FIG. 1, the plasma-resistant member according to an embodiment of the present disclosure may include a substrate 10, a lower layer 20 disposed on the substrate 10, a buffer layer 30 disposed on the lower layer 20, and an upper layer 40 disposed on the buffer layer 30. A stacked structure including the lower layer 20, the buffer layer 30, and the upper layer 40 as a whole may function as a corrosion resistance layer.

At least one of the lower layer 20, the buffer layer 30, and the upper layer 40 may be a vapor deposition film formed through vapor deposition. According to an embodiment, the lower layer 20, the buffer layer 30, and the upper layer 40 may be formed through vapor deposition.

According to an embodiment, the vapor deposition may be physical vapor deposition. For example, the physical vapor deposition may include a thermal evaporation method, an electron beam evaporation method, a sputtering method, and the like. According to an embodiment, the lower layer 20, the buffer layer 30, and the upper layer 40 may be deposited through an electron beam evaporation method.

For example, the substrate 10 may include ceramic or a metal. The ceramic may include alumina, aluminum nitride, silicon nitride, silicon carbide, zirconia, yttrium-aluminum-garnet (YAG), sapphire, quartz, or a combination thereof.

The metal may include stainless steel (SUS), alloy tool steel, carbon tool steel, chromium steel, aluminum, chromium molybdenum steel, nickel chromium molybdenum steel, or a combination thereof.

According to an embodiment, the substrate 10 may include ceramics such as alumina, aluminum nitride, silicon nitride, silicon carbide, quartz, and the like.

According to an embodiment, the lower layer 20 may include yttrium oxide (yttria, $Y_2O_3$). Yttrium oxide has high corrosion resistance to plasma. Accordingly, a lower layer 20 including yttrium oxide may prevent the substrate 10 from being damaged by plasma. For example, the lower layer 20 may have a thickness of 0.1 μm to 100 μm. When the thickness of the lower layer 20 is excessively thin, the lifespan of the corrosion resistance performance may be shortened, and if the thickness is excessively large, manufacturing time and cost may excessively increase.

Since the lower layer 20 is formed through vapor deposition, the lower layer may have crystallinity. For example, the average grain size of yttrium oxide of the lower layer 20 may be 10 nm to 1,000 nm.

According to an embodiment, the upper layer 40 includes yttrium oxyfluoride ($YO_xF_y$) or fluorine-rich yttrium oxide. According to an embodiment, the upper layer 40 including yttrium oxyfluoride or fluorine-rich yttrium oxide may constitute an outermost layer of the plasma-resistant stacked structure so that the upper layer 40 may be exposed to plasma during a plasma treatment process.

Plasma generated in a plasma processing apparatus may include halogen-based plasma such as fluorine plasma or chlorine plasma. For example, when the yttrium oxide of the lower layer 20 is exposed to fluorine plasma, contaminant particles containing fluorine may be formed on the surface of the lower layer 20. The contaminant particles may be desorbed during the plasma treatment process, and may contaminate a wafer, reducing the process yield. In addition, as fluorine radicals in the plasma may diffuse by reacting with yttrium oxide, the composition of the plasma may vary depending on the region, and thus the uniformity of the plasma treatment process may be deteriorated.

The upper layer 40 may contain yttrium oxyfluoride or fluorine-rich yttrium oxide, thereby suppressing generation of contaminant particles on the surface thereof, and improving the uniformity of plasma. For example, the thickness of the upper layer 40 may be 0.1 μm to 100 μm. In an embodiment, the thickness of the upper layer 40 may be 1 μm to 50 μm.

The composition of the upper layer 40 may vary depending on process conditions and the like. According to an embodiment, the upper layer 40 may have a YOF composition in which an atomic ratio of oxygen and fluorine is about 1:1. However, embodiments of the present disclosure are not limited thereto. For example, the upper layer may have a composition of $Y_5O_4F_7$, a mixture of YOF and $Y_5O_4F_7$, or further include yttrium fluoride ($YF_3$) or yttrium oxide ($Y_2O_3$).

According to an embodiment, the buffer layer 30 may be designed to have a thermal expansion coefficient between a thermal expansion coefficient of the lower layer 20 and a thermal expansion coefficient of the upper layer 40. For example, the thermal expansion coefficient of the buffer layer 30 may be $8\times10^{-6\circ}$ $C.^{-1}$ to $20\times10^{-6\circ}$ $C.^{-1}$. Preferably, the thermal expansion coefficient of the buffer layer 30 may be $10\times10^{-6\circ}$ $C.^{-1}$ to $15\times10^{-6\circ}$ $C.^{-1}$. More preferably, the thermal expansion coefficient of the buffer layer 30 may be $11\times10^{-6\circ}$ $C.^{-1}$ to $14\times10^{-6\circ}$ $C.^{-1}$.

The yttrium oxide of the lower layer 20 and the material (yttrium oxyfluoride or fluorine-rich yttrium oxide) of the upper layer 40 have mutually different thermal expansion coefficients. Accordingly, when the upper layer 40 is directly deposited on the lower layer 20, the surface roughness and cracks of the upper layer 40 may increase due to a difference in the thermal expansion coefficient. Thus, the generation of contaminant particles on the surface of the upper layer 40 may increase and the lifespan of the stacked structure may be shortened.

According to embodiments of the present disclosure, the difference in the thermal expansion coefficient between the buffer layer 30 and the upper layer 40 is smaller than the difference in the thermal expansion coefficient between the lower layer 20 and the upper layer 40. Therefore, when the upper layer 40 is deposited on the buffer layer 30, the surface roughness of the upper layer 40 may be reduced and cracks may be suppressed.

For example, the upper layer 40 deposited on the buffer layer 30 may have a root mean square (rms) surface roughness of 10 nm or less, preferably 5 nm or less.

For example, the material of the buffer layer 30 may include yttria-stabilized zirconia (YSZ, thermal expansion coefficient: about $13\times10^{-6\circ}$ $C.^{-1}$), magnesium oxide (MgO, thermal expansion coefficient: about $13.5\times10^{-6\circ}$ $C.^{-1}$), lanthanum zirconate (thermal expansion coefficient: about $10\times10^{-6\circ}$ $C.^{-1}$ to $12\times10^{-6\circ}$ $C.^{-1}$) or a combination thereof.

According to an embodiment, the buffer layer 30 may include yttria-stabilized zirconia. The yttria-stabilized zirconia may have a thermal expansion coefficient close to an intermediate value of the thermal expansion coefficients of yttrium oxide and yttrium oxide fluoride. In addition, since the yttria-stabilized zirconia has a crystal structure similar to that of yttrium oxide, a buffer layer 30 having a low surface roughness may be formed, and the adhesion to the lower layer 20 may be high. Accordingly, the buffer layer 30 including the yttria-stabilized zirconia may improve the stability of the stacked structure and the film quality of the upper layer 40.

For example, the thickness of the buffer layer 30 may be 0.1 μm to 100 μm. In an embodiment, the thickness of the buffer layer 30 may be 1 μm to 50 μm.

According to an embodiment, the thickness of the lower layer 20 may be greater than the thickness of the buffer layer 30 and the thickness of the upper layer 40.

According to embodiments, the buffer layer 30 may have a multi-layer structure. For example, referring to FIG. 2, the plasma-resistant member may include a substrate 10, a lower layer 20 disposed on the substrate 10, a buffer layer 30 disposed on the lower layer 20 and having a multilayer structure, and an upper layer 40 disposed on the buffer layer 30. The lower layer 20 may include yttrium oxide, and the upper layer 40 may include yttrium oxyfluoride or fluorine-rich yttrium oxide.

The buffer layer 30 may include a first buffer layer 32 adjacent to the lower layer 20 and a second buffer layer 34 disposed on the first buffer layer 32 and adjacent to the upper layer 40. According to an embodiment, the first buffer layer 32 may come into contact with the lower layer 20, and the second buffer layer 34 may come into contact with the upper layer 40. However, embodiments of the present disclosure are not limited thereto, and other layers may be disposed between the lower layer 20 and the first buffer layer 32 and/or between the second buffer layer 34 and the upper layer 40.

The first buffer layer 32 and the second buffer layer 34 may include different materials from each other. The second buffer layer 34 may have a thermal expansion coefficient greater than a thermal expansion coefficient of the first buffer layer 32.

According to an embodiment, the first buffer layer 32 may include yttria-stabilized zirconia, and the second buffer layer 34 may include magnesium oxide.

According to an embodiment, the first buffer layer 32 may include lanthanum zirconate, and the second buffer layer 34 may include yttria-stabilized zirconia.

Referring to FIG. 3, the buffer layer 30 may include a first buffer layer 32 adjacent to the lower layer 20, a second buffer layer 34 disposed adjacent to the upper layer 40, and a third buffer layer 36 disposed between the first buffer layer 32 and the second buffer layer 34. The third buffer layer 36 may have a thermal expansion coefficient greater than that of the first buffer layer 32 and smaller than that of the second buffer layer 34.

According to an embodiment, the first buffer layer 32 may include lanthanum zirconate, the second buffer layer 34 may include magnesium oxide, and the third buffer layer 36 may include yttria-stabilized zirconia.

According to the above configuration, the difference in the thermal expansion coefficient between the buffer layer and the upper layer can be more reduced, or the film quality of the buffer layer can be improved. Therefore, the film quality of the upper layer formed on the buffer layer can be improved.

The plasma-resistant member according to the embodiments may be a component of a plasma treatment apparatus such as a plasma vapor deposition apparatus, a plasma etching apparatus, and the like. For example, the plasma-resistant member may be applied to a dielectric window, a showerhead, an electrostatic chuck, a heater, a chamber liner, a focus ring, a wall liner, and the like. However, embodiments of the present disclosure are not limited thereto, and may be applied to various parts that can be exposed to plasma.

According to embodiments of the present disclosure, the stacked structure having the plasma resistance performance may be formed through vapor deposition. Therefore, the stacked structure may have a denser structure than the plasma-resistant coating layer formed through a conventional spray coating without a heat treatment process for sintering.

In addition, the upper layer of the stacked structure may include yttrium oxyfluoride or fluorine-rich yttrium oxide, thereby suppressing generation of contaminant particles and reducing variations in plasma composition in the chamber.

In addition, the stacked structure may include the buffer layer disposed between the upper layer and the lower layer, thereby improving the quality of the upper layer. Accordingly, the surface roughness of the upper layer may be reduced, and cracks may be suppressed.

Method For Fabricating a Plasma-Resistant Member Having a Stacked Structure

Figure 4:
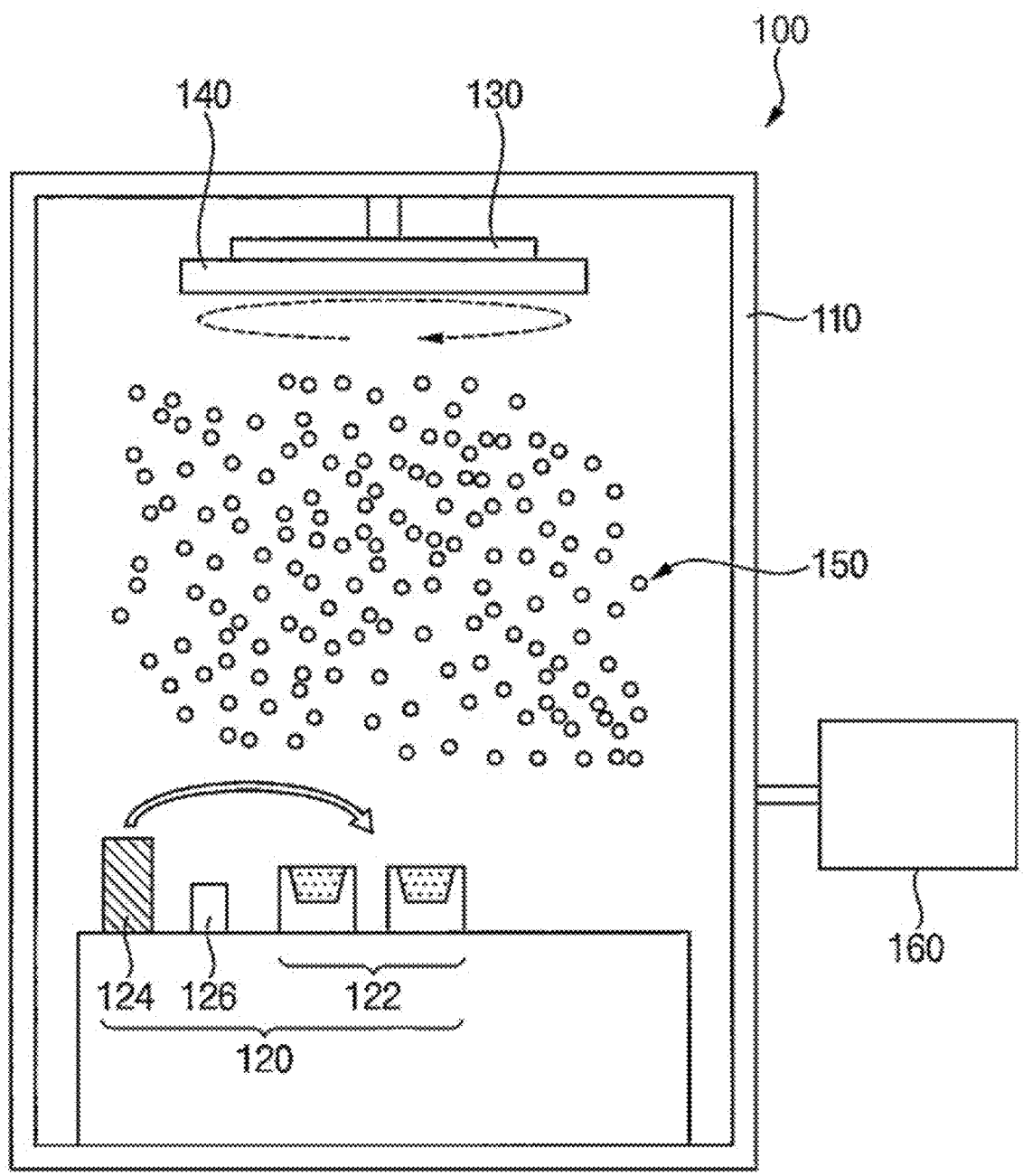
FIG. 4 is a schematic diagram illustrating a vapor deposition apparatus for fabricating a plasma-resistant member according to embodiments of the present disclosure.

FIG. 4 is a schematic diagram illustrating a vapor deposition apparatus for fabricating a plasma-resistant member according to embodiments of the present disclosure.

Referring to FIG. 4, the vapor deposition apparatus 100 may include a process chamber 110, a source vaporizer 120, and a fixing unit 130.

The process chamber 110 may provide a processing space sealed from an external space. The process chamber 110 may include, if necessary, a door for opening and closing the processing space, a vacuum pump for maintaining the processing space in a vacuum state and exhausting reaction by-products to the outside, and the like.

The fixing unit 130 for fixing the substrate 140 (or a base member) may be disposed in the process chamber 110. For example, the fixing unit 130 and the substrate 140 may be disposed in an upper region of the processing space, and the fixing unit 130 may clamp the substrate 140 or fix the substrate 140 through electrostatic or suction force. If necessary, the fixing unit 130 may have a configuration for applying a bias voltage to the substrate 140.

According to an embodiment, the fixing unit 130 may be rotatable. Since the fixing unit 130 rotates while the substrate 140 is being coated, the uniformity of the coating layer may be improved. Further, if necessary, the fixing unit 130 may have a configuration allowing tilting in order to change the vapor deposition angle or vapor deposition area.

According to an embodiment, the source vaporizer 120 may include an evaporation source receiving unit 122 for accommodating an evaporation source and an electron gun 124 for generating an electron beam.

The electron gun 124 may be connected to a power supply to generate an electron beam according to power applied thereto. The electron beam is incident onto the evaporation source to vaporize the evaporation source. Accordingly, vapor deposition particles 150 may be generated, and the vapor deposition particles 150 may be deposited on the substrate 140 to form a coating layer. For example, the electron gun 124 may include a filament for emitting hot electrons.

The evaporation source receiving unit 122 may be, for example, a crucible with an open upper side. If necessary, the evaporation source receiving unit 122 may further include a shutter (not shown) capable of opening and closing an upper opening. The evaporation source receiving unit 122 may include a plurality of units. For example, when a coating layer to be deposited requires a plurality of evaporation sources, a plurality of crucibles for receiving the plurality of evaporation sources, respectively, may be used. In addition, a plurality of crucibles may be used to control the composition of elements in the coating layer.

In addition, the source vaporizer 120 may further include a magnetic member 126. The magnetic member 126 may deflect the electron beam so that the electron beam generated from the electron gun 124 may be incident onto the evaporation source in the evaporation source receiving unit 122. For example, the magnetic member 126 may be a permanent magnet.

According to an embodiment, the vapor deposition apparatus 100 may include a gas providing unit 160 for providing a process gas into the process chamber 110. For example, the process gas may be oxygen gas. For example, the ratio of oxygen in the coating layer deposited on the substrate 140 may be adjusted according to the concentration of the oxygen gas. However, embodiments of the present disclosure are not limited thereto, and the process gas may include an inert gas such as argon or helium.

According to an embodiment, the vapor deposition apparatus 100 may further include a sensor (not shown) for measuring the thickness of the coating layer deposited on the substrate 140. Information on the thickness of the coating layer, vapor deposition rate, etc. can be obtained through the sensor, and process conditions may be controlled based on the information.

According to an embodiment, the vapor deposition apparatus 100 may further include a heating unit (not shown) for heating the substrate 140. For example, in order to remove impurities such as moisture, the substrate 140 may be heated before the vapor deposition process.

Figure 5:
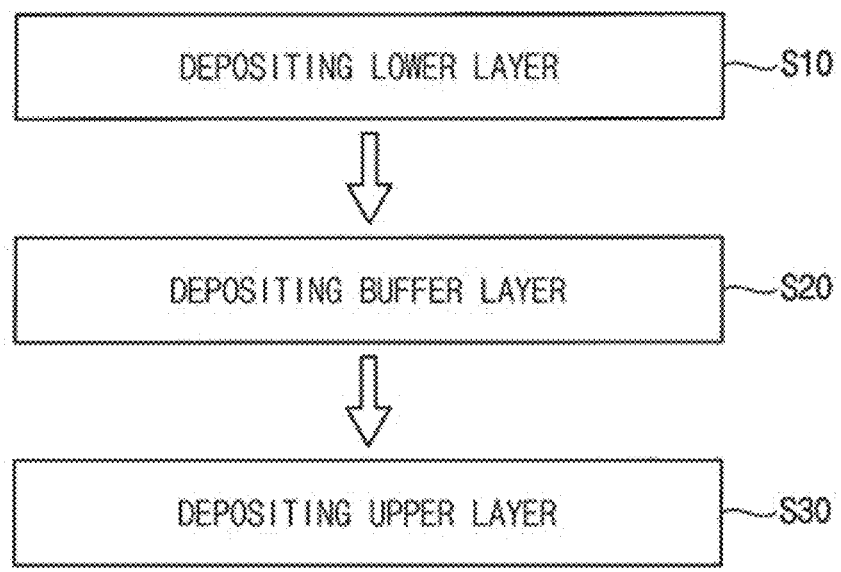
FIG. 5 is a flowchart showing a method for fabricating a plasma-resistant member according to an embodiment of the present disclosure.

FIG. 5 is a flowchart showing a method for fabricating a plasma-resistant member according to an embodiment of the present disclosure.

Referring to FIGS. 1 and 5, the lower layer 20 is deposited on the substrate 10 (S10).

For example, when the lower layer 20 includes yttrium oxide, yttrium oxide may be used as an evaporation source. The yttrium oxide of the evaporation source may be powder or a sintered body. When a yttrium oxide sintered body is used as the evaporation source, the crystal orientation of the lower layer 20 may be improved.

Thereafter, the buffer layer 30 is deposited on the lower layer 20 (S20).

For example, the buffer layer 30 may include yttria-stabilized zirconia, magnesium oxide, lanthanum zirconate, and the like. Various evaporation sources, which are generally known in the art, may be used according to the material and composition of the buffer layer 30. For example, when the buffer layer 30 includes yttria-stabilized zirconia, yttria-stabilized zirconia or a combination of yttrium oxide and zirconium oxide may be used as an evaporation source.

Thereafter, the upper layer 40 is deposited on the buffer layer 30 (S30).

For example, when the upper layer 40 includes yttrium oxyfluoride or fluorine-rich yttrium oxide, yttrium oxyfluoride, fluorine-rich yttrium oxide, or a combination of yttrium oxide and yttrium fluoride ($YF_3$) may be used as an evaporation source.

According to an embodiment, the lower layer 20, the buffer layer 30, and the upper layer 40 may be formed through physical vapor deposition, for example, by using the vapor deposition apparatus shown in FIG. 4.

Evaporation sources for forming the lower layer 20, the buffer layer 30, and the upper layer 40 may have a solid phase. For example, the solid phase may be in the form of pellets, flakes, ingots, and the like. The evaporation sources for forming the lower layer 20, the buffer layer 30, and the upper layer 40 may be referred to as a first evaporation source, a second evaporation source, and a third evaporation source, respectively.

For example, the composition of elements contained in each layer may be controlled by adjusting the number of crucibles that receive the evaporation sources.

For example, in the vapor deposition process, the temperature of the substrate 10 may be 100° C. to 700° C. Power applied to the electron gun may be 1 kW to 10 kW. A degree of vacuum of the process chamber may be 0.01 mTorr to 1 mTorr while the evaporation source is being evaporated. The deposition rate of the layers may be 10 nm/min to 200 nm/min. The rotation speed of the fixing unit may be 1 rpm to 100 rpm. In addition, in the vapor deposition process, oxygen gas may be provided, and the flow rate may be 1 sccm to 1,000 sccm. However, the above conditions are illustrative only, and embodiments of the present disclosure are not limited thereto, and various ranges and various combinations may be used as necessary.

Hereinafter, the effects of the present disclosure will be described through specific examples.

Example 1

A silicon substrate having a diameter of 50 mm, which was mirror-polished to have an average surface roughness of 10 nm or less, was mounted on a fixing unit of an electron beam evaporation apparatus having a configuration substantially the same as that shown in FIG. 4 (distance from evaporation source: 480 mm).

Under the following process conditions, an electron beam was incident onto the evaporation source, and when the evaporation source was melted and vaporization started, the shutter on the evaporation source was opened, so that a lower layer having a thickness of 2 μm, a buffer layer having a thickness of 1 μm, and an upper layer having a thickness of 1 μm were sequentially formed.

Substrate temperature: 600° C.
Substrate rotation speed: 20 rpm
Oxygen flow rate: 5 sccm
Chamber vacuum degree: 0.1 mTorr
Vapor deposition rate: 2 nm/sec
Lower layer evaporation source: $Y_2O_3$
Buffer layer evaporation source: YSZ
Upper layer evaporation source: YOF Comparative Example 1

A stacked structure of an upper layer and a lower layer was formed on a substrate in the same manner as in Example 1, except that the buffer layer was not formed.

Figure 6:
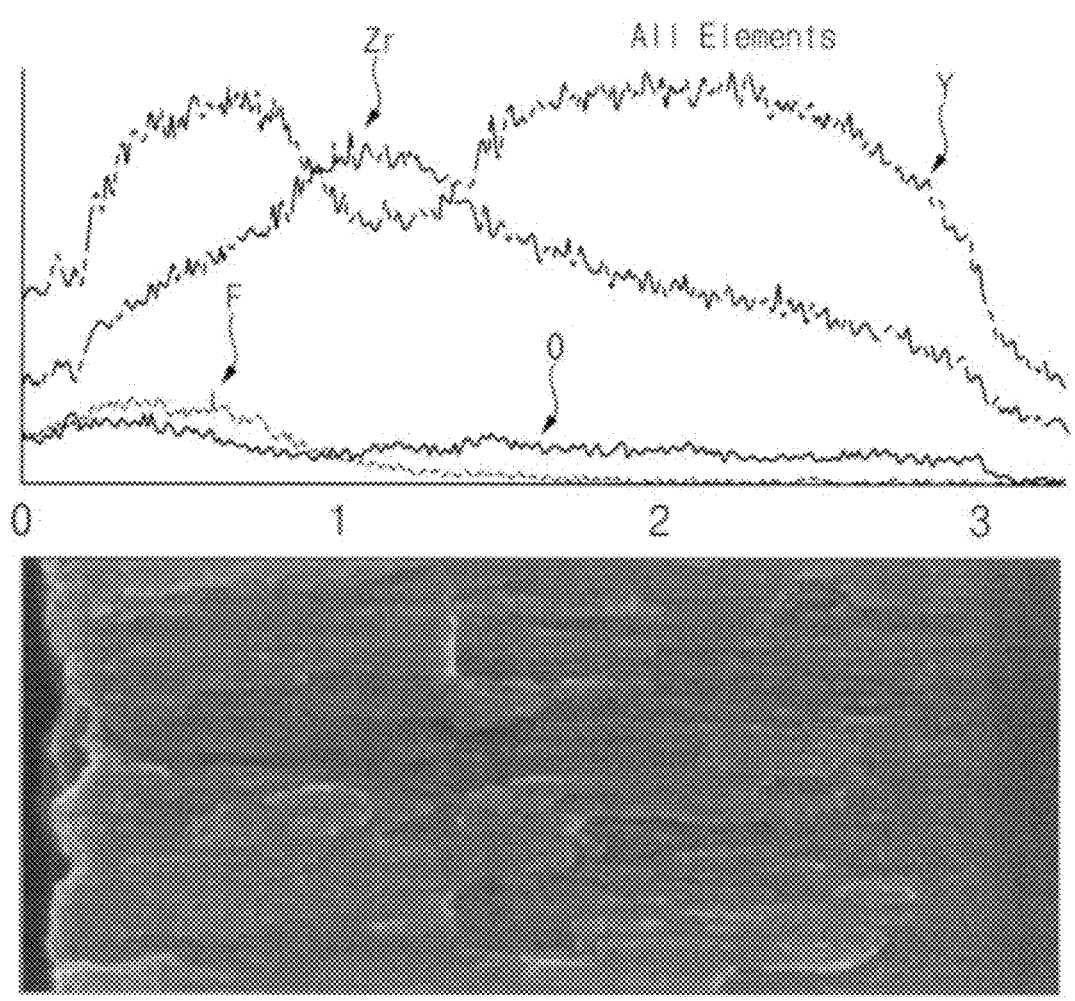
FIG. 6 is a scanning electron microscope (SEM) photograph showing a cross section of a stacked structure obtained in Example 1 and an energy dispersive spectroscopy (EDS) graph according to depth.

FIG. 6 is a scanning electron microscope (SEM) photograph showing a cross-section of the stacked structure obtained in Example 1 and an energy dispersive spectroscopy (EDS) graph according to depth.

Referring to FIG. 6, it was confirmed that an upper layer including yttrium oxyfluoride (Y, F, O), a buffer layer including yttria-stabilized zirconia (Y, Zr, O), and a lower layer including yttrium oxide (Y, O) were formed (the Zr peak in the region excluding the intermediate region was noise).

Figure 7A:
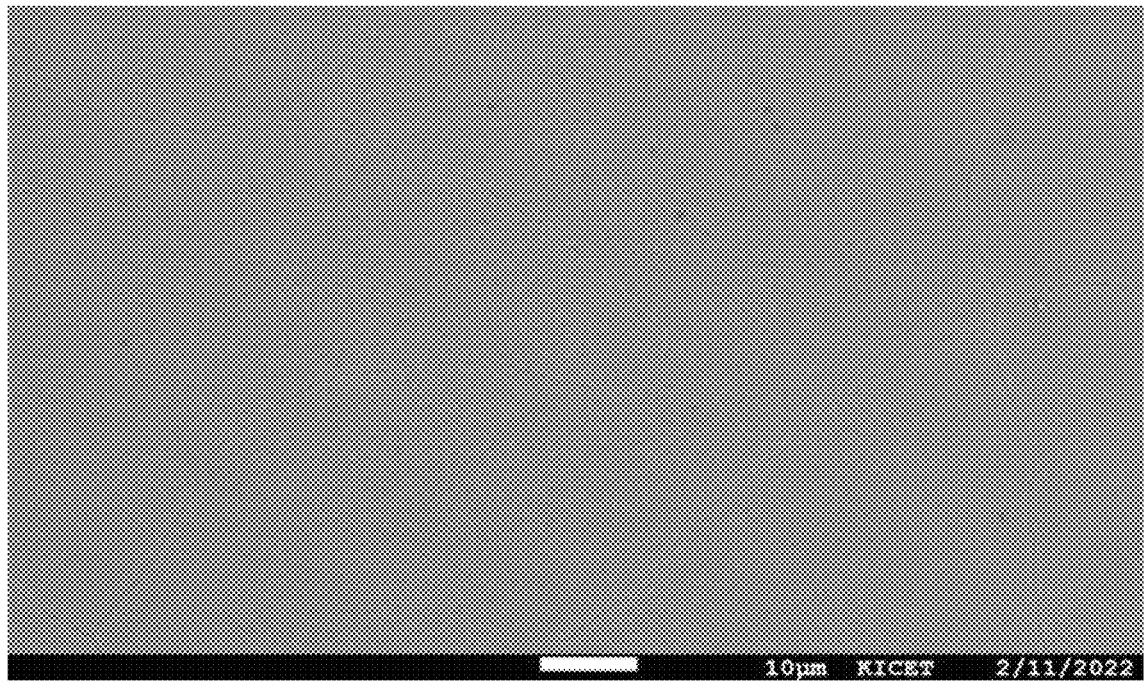
FIG. 7A is an SEM photograph showing a top surface of a stacked structure obtained in Example 1.
Figure 7B:
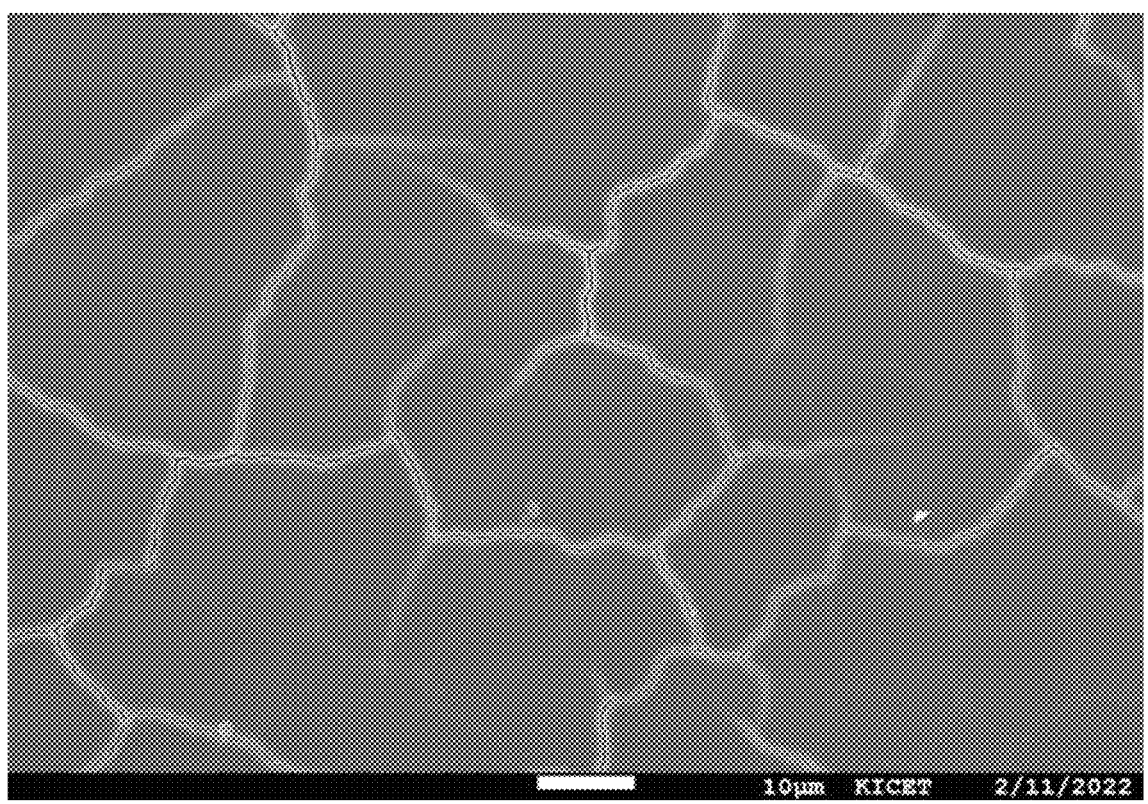
FIG. 7B is an SEM photograph showing a top surface of a stacked structure obtained in Comparative Example 1.

FIG. 7A is an SEM photograph showing a top surface of the stacked structure obtained in Example 1. FIG. 7B is an SEM photograph showing a top surface of the stacked structure obtained in Comparative Example 1.

Referring to FIGS. 7A and 7B, it was confirmed that cracks were suppressed by forming an upper layer including yttrium oxyfluoride or fluorine-rich yttrium oxide on a buffer layer including YSZ.

Embodiments of the disclosure may be used in a device for producing plasma, and manufacture and coating of various members that may be exposed to plasma.

Although reference has been made to example embodiments of the present disclosure, it will be understood to those skilled in the art that various modifications and variations are possible without departing from the idea and scope of the present disclosure described in the following claims.

What is claimed is:

1. A plasma-resistant member comprising:
   a lower layer disposed on a substrate and comprising yttrium oxide;
   a buffer layer disposed on the lower layer; and
   an upper layer disposed on the buffer layer and comprising yttrium oxyfluoride or fluorine-rich yttrium oxide,
   wherein the buffer layer has a thermal expansion coefficient between a thermal expansion coefficient of the upper layer and a thermal expansion coefficient of the lower layer,
   wherein the buffer layer comprises a first buffer layer adjacent to the lower layer and a second buffer layer disposed on the first buffer layer and adjacent to the upper layer, and wherein the second buffer layer has a thermal expansion coefficient greater than a thermal expansion coefficient of the first buffer layer, and
   wherein:

(a) the first buffer layer comprises lanthanum zirconate, and the second buffer layer comprises yttria-stabilized zirconia, (b) the first buffer layer comprises yttria-stabilized zirconia, and the second buffer layer comprises magnesium oxide, or (c) the buffer layer further comprises a third buffer layer disposed between the first buffer layer and the second buffer layer, wherein the third buffer layer has a thermal expansion coefficient greater than the thermal expansion coefficient of the first buffer layer and smaller than the thermal expansion coefficient of the second buffer layer, and wherein the first buffer layer comprises lanthanum zirconate, the second buffer layer comprises magnesium oxide, and the third buffer layer comprises yttria-stabilized zirconia.

2. The plasma-resistant member of claim 1, wherein the lower layer, the buffer layer and the upper layer are formed through vapor deposition.

3. The plasma-resistant member of claim 1, wherein the thermal expansion coefficient of the buffer layer is $10 \times 10^{-6}$ C.$^{-1}$ to $15 \times 10^{-6}$ C.$^{-1}$.

4. The plasma-resistant member of claim 1, wherein the first buffer layer comprises lanthanum zirconate, and the second buffer layer comprises yttria-stabilized zirconia.

5. The plasma-resistant member of claim 1, wherein the first buffer layer comprises yttria-stabilized zirconia, and the second buffer layer comprises magnesium oxide.

6. The plasma-resistant member of claim 1, wherein the buffer layer further comprises a third buffer layer disposed between the first buffer layer and the second buffer layer, wherein the third buffer layer has a thermal expansion coefficient greater than the thermal expansion coefficient of the first buffer layer and smaller than the thermal expansion coefficient of the second buffer layer, and wherein the first buffer layer comprises lanthanum zirconate, the second buffer layer comprises magnesium oxide, and the third buffer layer comprises yttria-stabilized zirconia.

7. The plasma-resistant member of claim 1, wherein each of the lower layer, the buffer layer and the upper layer has a thickness of 0.1 μm to 100 μm.

8. A method for fabricating a plasma-resistant member, the method comprising:
depositing a lower layer comprising yttrium oxide on a substrate;
depositing a buffer layer on the lower layer; and
depositing an upper layer on the buffer layer, the upper layer comprising yttrium oxyfluoride or fluorine-rich yttrium oxide,
wherein the buffer layer has a thermal expansion coefficient between a thermal expansion coefficient of the upper layer and a thermal expansion coefficient of the lower layer,
wherein the buffer layer comprises a first buffer layer adjacent to the lower layer and a second buffer layer disposed on the first buffer layer and adjacent to the upper layer, and wherein the second buffer layer has a thermal expansion coefficient greater than a thermal expansion coefficient of the first buffer layer, and
wherein:

(a) the first buffer layer comprises lanthanum zirconate, and the second buffer layer comprises yttria-stabilized zirconia, (b) the first buffer layer comprises yttria-stabilized zirconia, and the second buffer layer comprises magnesium oxide, or (c) the buffer layer further comprises a third buffer layer disposed between the first buffer layer and the second buffer layer, wherein the third buffer layer has a thermal expansion coefficient greater than the thermal expansion coefficient of the first buffer layer and smaller than the thermal expansion coefficient of the second buffer layer, and wherein the first buffer layer comprises lanthanum zirconate, the second buffer layer comprises magnesium oxide, and the third buffer layer comprises yttria-stabilized zirconia.

9. The method of claim 8, wherein an evaporation source for the lower layer, the buffer layer and the upper layer is evaporated by electron beam.

10. The method of claim 8, wherein the first buffer layer comprises lanthanum zirconate, and the second buffer layer comprises yttria-stabilized zirconia.

11. The method of claim 8, wherein the first buffer layer comprises yttria-stabilized zirconia, and the second buffer layer comprises magnesium oxide.

12. The method of claim 8, wherein the buffer layer further comprises a third buffer layer disposed between the first buffer layer and the second buffer layer, wherein the third buffer layer has a thermal expansion coefficient greater than the thermal expansion coefficient of the first buffer layer and smaller than the thermal expansion coefficient of the second buffer layer, and wherein the first buffer layer comprises lanthanum zirconate, the second buffer layer comprises magnesium oxide, and the third buffer layer comprises yttria-stabilized zirconia.

13. The method of claim 8, wherein each of the lower layer, the buffer layer and the upper layer has a thickness of 0.1 μm to 100 μm.

14. The method of claim 8, wherein the method further comprises conducting the fabricating of the plasma-resistant member in an apparatus comprising a process chamber, wherein a degree of vacuum of the process chamber is 0.01 mTorr to 1 mTorr, a deposition rate is 10 nm/min to 200 nm/min, and oxygen gas is provided in the process chamber at a flow rate of 1 sccm to 1,000 sccm, when the lower layer, the buffer layer or the upper layer is deposited.

15. A plasma-resistant member comprising:
a lower layer disposed on a substrate and comprising yttrium oxide;
a buffer layer disposed on the lower layer; and
an upper layer disposed on the buffer layer and comprising yttrium oxyfluoride or fluorine-rich yttrium oxide,
wherein the buffer layer has a thermal expansion coefficient between a thermal expansion coefficient of the upper layer and a thermal expansion coefficient of the lower layer,
wherein the buffer layer comprises a first buffer layer adjacent to the lower layer and a second buffer layer disposed on the first buffer layer and adjacent to the upper layer, and wherein the second buffer layer has a thermal expansion coefficient greater than a thermal expansion coefficient of the first buffer layer, and
wherein the buffer layer further comprises a third buffer layer disposed between the first buffer layer and the second buffer layer, and wherein the third buffer layer has a thermal expansion coefficient greater than the thermal expansion coefficient of the first buffer layer and smaller than the thermal expansion coefficient of the second buffer layer.

16. A method for fabricating a plasma-resistant member, the method comprising:
depositing a lower layer comprising yttrium oxide on a substrate;

depositing a buffer layer on the lower layer; and
depositing an upper layer on the buffer layer, the upper layer comprising yttrium oxyfluoride or fluorine-rich yttrium oxide,
wherein the buffer layer has a thermal expansion coefficient between a thermal expansion coefficient of the upper layer and a thermal expansion coefficient of the lower layer,
wherein the plasma-resistant member is a plasma-resistant member of claim 15.

* * * * *